(12) United States Patent
Woo et al.

(10) Patent No.: US 11,845,401 B2
(45) Date of Patent: Dec. 19, 2023

(54) VEHICLE KEY AND METHOD OF MANUFACTURING THE SAME

(71) Applicants: HYUNDAI MOTOR COMPANY, Seoul (KR); KIA MOTORS CORPORATION, Seoul (KR); Korea Polytechnic University Industry Academic Cooperation Foundation, Siheung-si (KR)

(72) Inventors: Ji Hyun Woo, Seoul (KR); Chang-Kyu Kim, Seoul (KR)

(73) Assignees: Hyundai Motor Company, Seoul (KR); Kia Motors Corporation, Repubilc of (KR); Korea Polytechnic University Industry Academic Cooperation Foundation, Siheung-si (KR)

( * ) Notice: Subject to any disclaimer, the term of this patent is extended or adjusted under 35 U.S.C. 154(b) by 327 days.

(21) Appl. No.: 17/100,344

(22) Filed: Nov. 20, 2020

(65) Prior Publication Data

US 2021/0268993 A1    Sep. 2, 2021

(30) Foreign Application Priority Data

Mar. 2, 2020    (KR) ......................... 10-2020-0026240

(51) Int. Cl.
*B60R 25/40* (2013.01)
*H02N 1/08* (2006.01)
*B81B 3/00* (2006.01)
*B81C 1/00* (2006.01)
*B60R 25/24* (2013.01)

(52) U.S. Cl.
CPC ............ *B60R 25/406* (2013.01); *B60R 25/24* (2013.01); *B81B 3/0021* (2013.01); *B81C 1/00166* (2013.01); *H02N 1/08* (2013.01); *B81B 2203/0136* (2013.01); *B81B 2203/04* (2013.01); *B81C 2201/013* (2013.01)

(58) Field of Classification Search
CPC ..... B60R 25/406; B60R 25/24; B81B 3/0021; B81B 2203/0136; B81B 2203/04; B81C 1/00166; B81C 2201/013; H02N 1/08
See application file for complete search history.

(56) References Cited

U.S. PATENT DOCUMENTS

2001/0035723 A1* 11/2001 Pelrine ................. H10N 30/857
  318/116
2008/0258553 A1* 10/2008 Christenson ............ B60R 25/24
  307/10.2

(Continued)

*Primary Examiner* — Thomas D Alunkal
(74) *Attorney, Agent, or Firm* — Slater Matsil, LLP

(57) ABSTRACT

A vehicle key capable of generating electrical energy by itself through energy harvesting, and a method of manufacturing the vehicle key are provided. The vehicle key includes a power generator including an energy generation module configured to generate electrical energy using energy harvesting and an electric condenser configured to store the generated electrical energy; an inputter configured to receive a user input; a communicator configured to communicate with the vehicle; and a controller configured to control the communicator to transmit a control signal corresponding to the received user input to the vehicle. At least one of the inputter, the communicator, and the controller may be configured to receive power from the power generator.

19 Claims, 15 Drawing Sheets

(56) References Cited

U.S. PATENT DOCUMENTS

| | | | |
|---|---|---|---|
| 2010/0141094 A1* | 6/2010 | Lee | H02N 2/186 |
| | | | 310/339 |
| 2010/0171642 A1* | 7/2010 | Hassan | G01S 13/825 |
| | | | 340/992 |
| 2010/0291965 A1* | 11/2010 | Tabe | H04M 1/6083 |
| | | | 455/550.1 |
| 2012/0249073 A1* | 10/2012 | Layne | H02J 7/32 |
| | | | 320/114 |
| 2019/0058242 A1* | 2/2019 | Tabe | H01Q 1/248 |

* cited by examiner

FIG.14
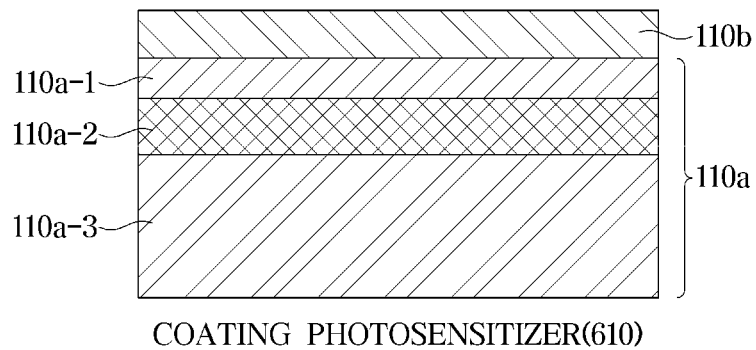
COATING PHOTOSENSITIZER(610)
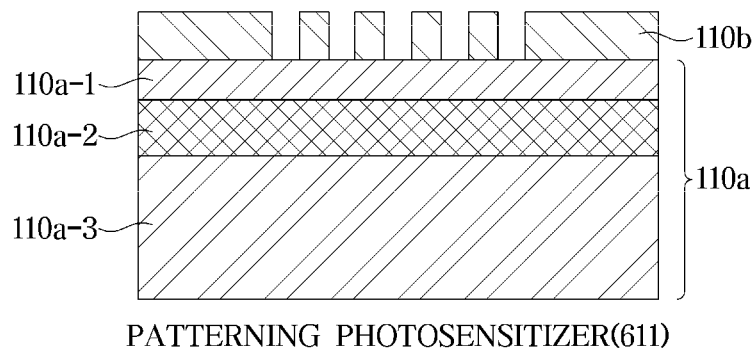
PATTERNING PHOTOSENSITIZER(611)
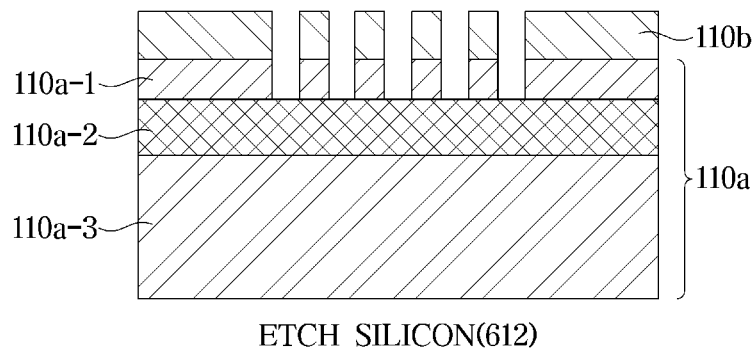
ETCH SILICON(612)
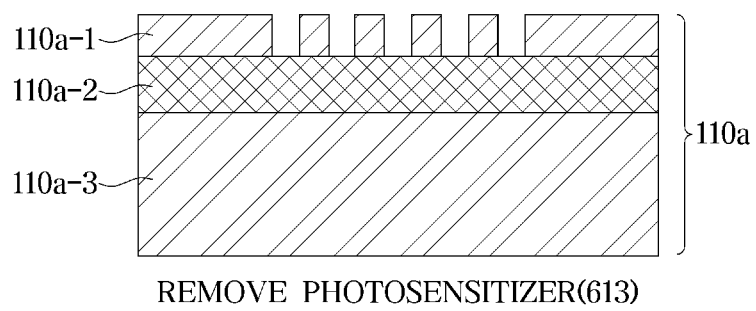
REMOVE PHOTOSENSITIZER(613)

FIG.15
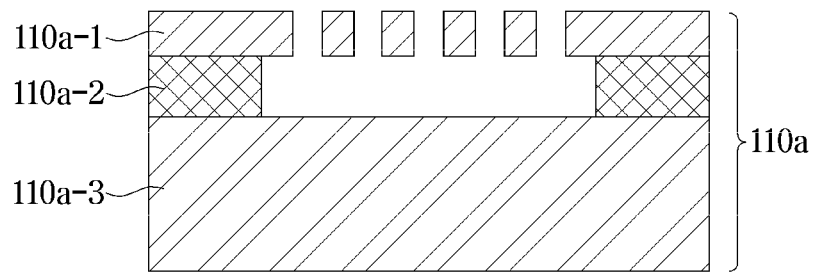
SELECTIVELY ETCH SILICON OXIDE FILM(614)
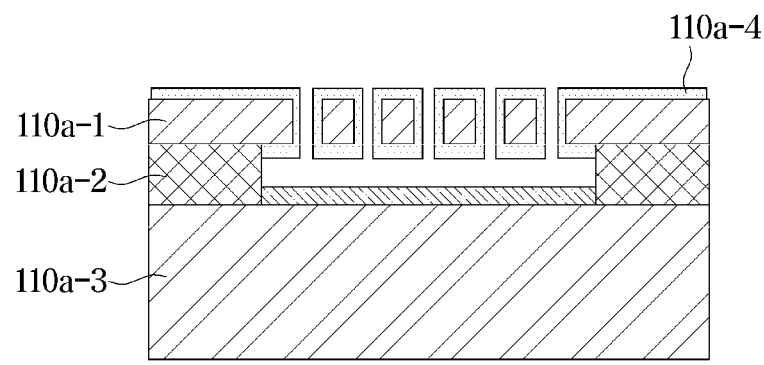
FORM SILICON OXIDE FILM
AND INJECT FIXED CHARGE(615)
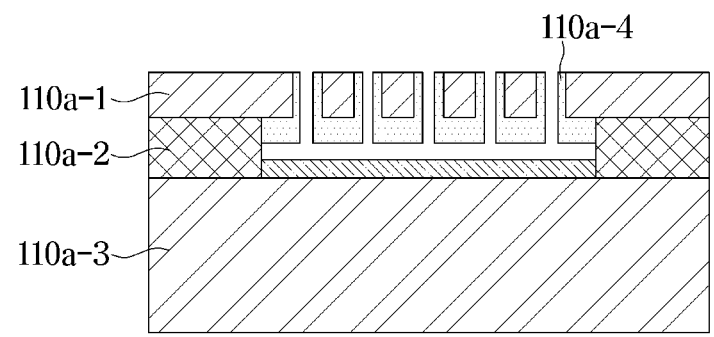
ETCH SILICON OXIDE FILM ON SURFACE (616)
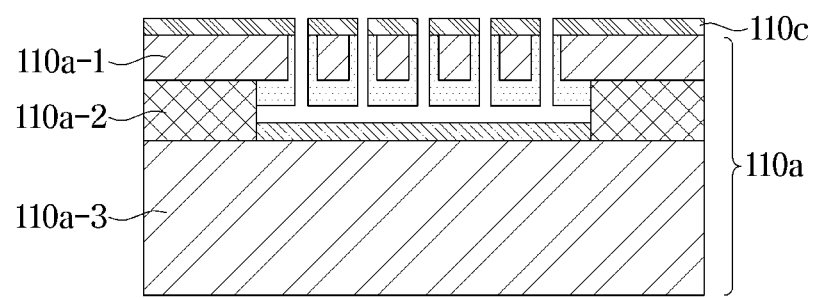
DEPOSIT METAL(617)

VEHICLE KEY AND METHOD OF MANUFACTURING THE SAME

CROSS-REFERENCE TO RELATED APPLICATION

The present application claims priority to and the benefit of Korean Patent Application No. 10-2020-0026240, filed on Mar. 2, 2020, the disclosure of which is incorporated by reference in its entirety.

TECHNICAL FIELD

The disclosure relates to a vehicle key and a method of manufacturing the same.

BACKGROUND

For drivers' convenience, a vehicle key whereby a door of a vehicle can be opened or closed without inserting the vehicle key into a keyhole of the door, and whereby the vehicle can be started without inserting the vehicle key into a key box inside the vehicle has recently grown in popularity. The vehicle key may be referred to as various terms, e.g., a smart key or a key fob.

The vehicle key needs power to transmit and receive signals through wireless communication with the vehicle. The supply of power is mainly through a button-type battery, and the battery needs to be replaced periodically and is a limitation in reducing a size of the vehicle key.

SUMMARY

An aspect of the disclosure is to provide a vehicle key capable of generating electrical energy by itself through energy harvesting, and a method of manufacturing the vehicle key.

Another aspect of the disclosure is to provide a vehicle key capable of generating electrical energy using vibration applied to the vehicle key in generating the electrical energy by itself through energy harvesting, and a method of manufacturing the vehicle key.

Another aspect of the disclosure is to provide a vehicle key capable of improving compatibility with a semiconductor processes and converting low frequency vibration to energy by employing electrostatic energy harvesting in generating electrical energy using vibration applied to the vehicle key, and a method of manufacturing the vehicle key.

Additional aspects of the disclosure will be set forth in part in the description which follows and, in part, will be obvious from the description, or may be learned by practice of the disclosure.

In accordance with an aspect of the disclosure, a vehicle key used to open and close a door of a vehicle, the vehicle key includes a power generator including an energy generation module configured to generate electrical energy using energy harvesting and an electric condenser configured to store the generated electrical energy; an inputter configured to receive a user input; a communicator configured to communicate with the vehicle; and a controller configured to control the communicator to transmit a control signal corresponding to the received user input to the vehicle. At least one of the inputter, the communicator, and the controller may be configured to receive power from the power generator.

The energy generation module may be configured to generate the electrical energy in an electrostatic manner using vibration.

The energy generation module may include a fixed electrode, and a moving electrode disposed in parallel with the fixed electrode. A current may flow between the fixed electrode and the moving electrode by a movement of the moving electrode.

The energy generation module may include an X-axis electrode module configured to generate a current by vibration in an X-axis direction; a Y-axis electrode module configured to generate the current by vibration in a Y-axis direction; and a Z-axis electrode module configured to generate the current by vibration in a Z-axis direction.

The X-axis electrode module may include an X-axis fixed electrode; and an X-axis moving electrode disposed in parallel with the X-axis fixed electrode, configured to move in the X-axis direction.

The Y-axis electrode module may include a Y-axis fixed electrode; and a Y-axis moving electrode disposed in parallel with the Y-axis fixed electrode, configured to move in the Y-axis direction.

The Z-axis electrode module may include a Z-axis fixed electrode; and a Z-axis moving electrode disposed in parallel with the Z-axis fixed electrode, configured to move in the Z-axis direction.

The X-axis electrode module may further include an X-axis spring configured to connect the X-axis moving electrode to a substrate. In the X-axis spring, a length of the X-axis may be shorter than a length of the Y-axis and a length of the Z-axis.

The Y-axis electrode module may further include a Y-axis spring configured to connect the Y-axis moving electrode to a substrate. In the Y-axis spring, a length of the Y-axis may be shorter than a length of the X-axis and a length of the Z-axis.

The Z-axis electrode module may further include a Z-axis spring configured to connect the Z-axis moving electrode to a substrate. In the Z-axis spring, a length of the Z-axis may be shorter than a length of the X-axis and a length of the Y-axis.

At least one of the fixed electrode and the moving electrode may include a non-conductive thin film formed on its surface. The non-conductive thin film may include the injected charge.

The power generator may further include a power control circuit configured to supply electrical energy generated by the energy generation module to the communicator and the controller.

The energy generation module may be manufactured by a semiconductor process.

In accordance with another aspect of the disclosure, in a method of manufacturing a vehicle key, the vehicle key includes an energy generation module including a fixed electrode, a moving electrode disposed in parallel with the fixed electrode, and a spring configured to connect the moving electrode to a substrate to generate electrical energy using energy harvesting, and in which a current flows between the fixed electrode and the moving electrode by a movement of the moving electrode. The method includes coating a photosensitizer on a silicon-on-insulator (SOI) wafer including a silicon substrate, a silicon oxide film, and a silicon; patterning the photosensitizer in the shape of the fixed electrode, the moving electrode, and the spring using an exposure process; etching the silicon on a top layer of the SOI substrate using the patterned photosensitizer; removing the photosensitizer; selectively etching the silicon oxide film between the silicon and the silicon substrate so that the moving electrode can move; forming the silicon oxide film on the surface of the silicon substrate and the silicon and injecting a fixed charge; removing the topmost silicon oxide film from the formed silicon oxide film; and depositing a metal used as an electrode on the top layer.

DRAWINGS

These and/or other aspects of the disclosure will become apparent and more readily appreciated from the following description of the embodiments, taken in conjunction with the accompanying drawings of which:

Figure 4:
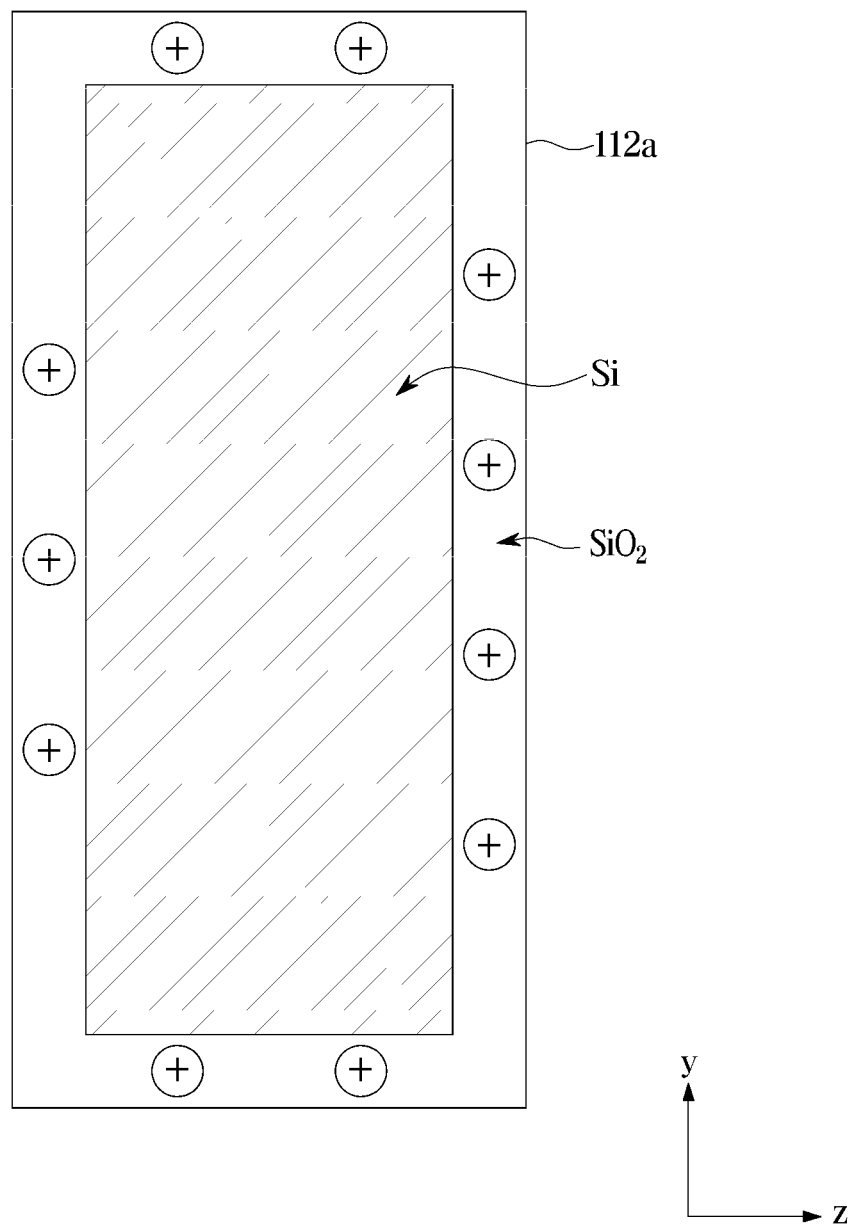
Figure 5:
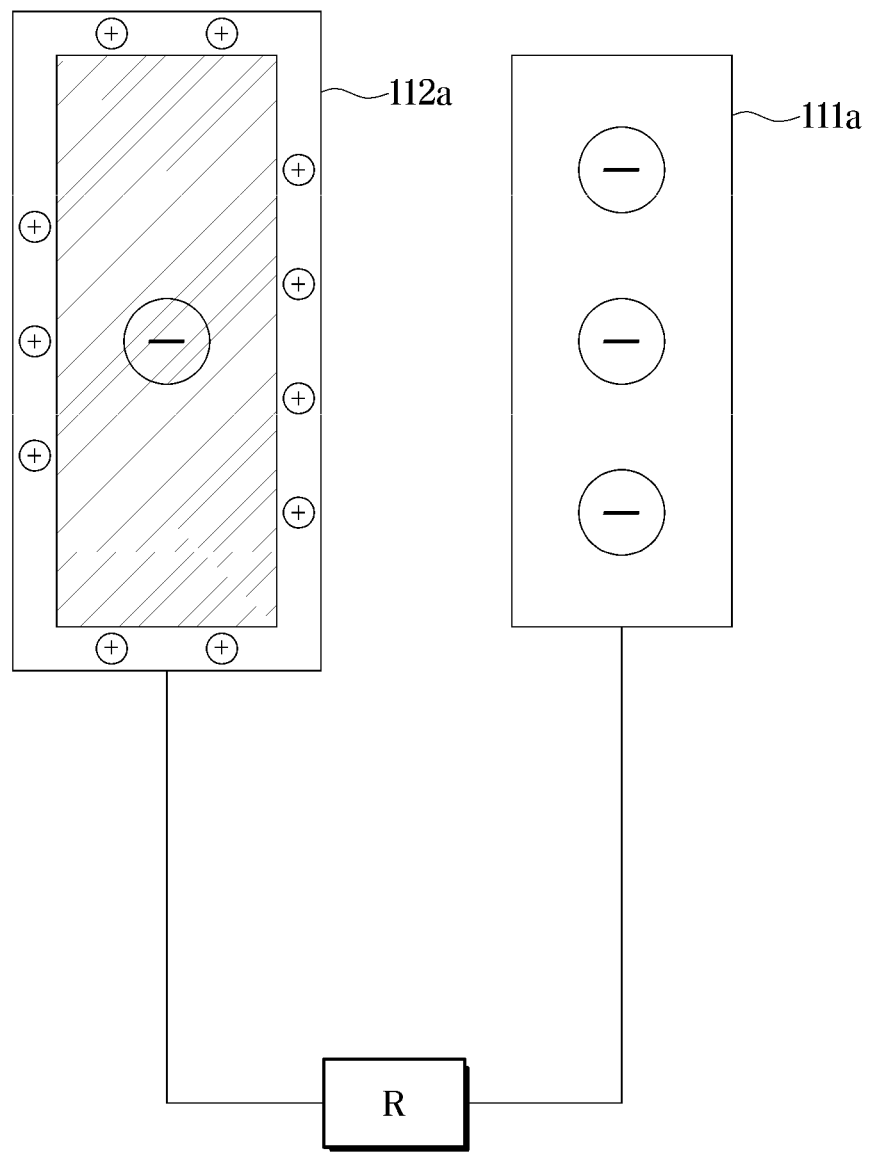
Figure 6:
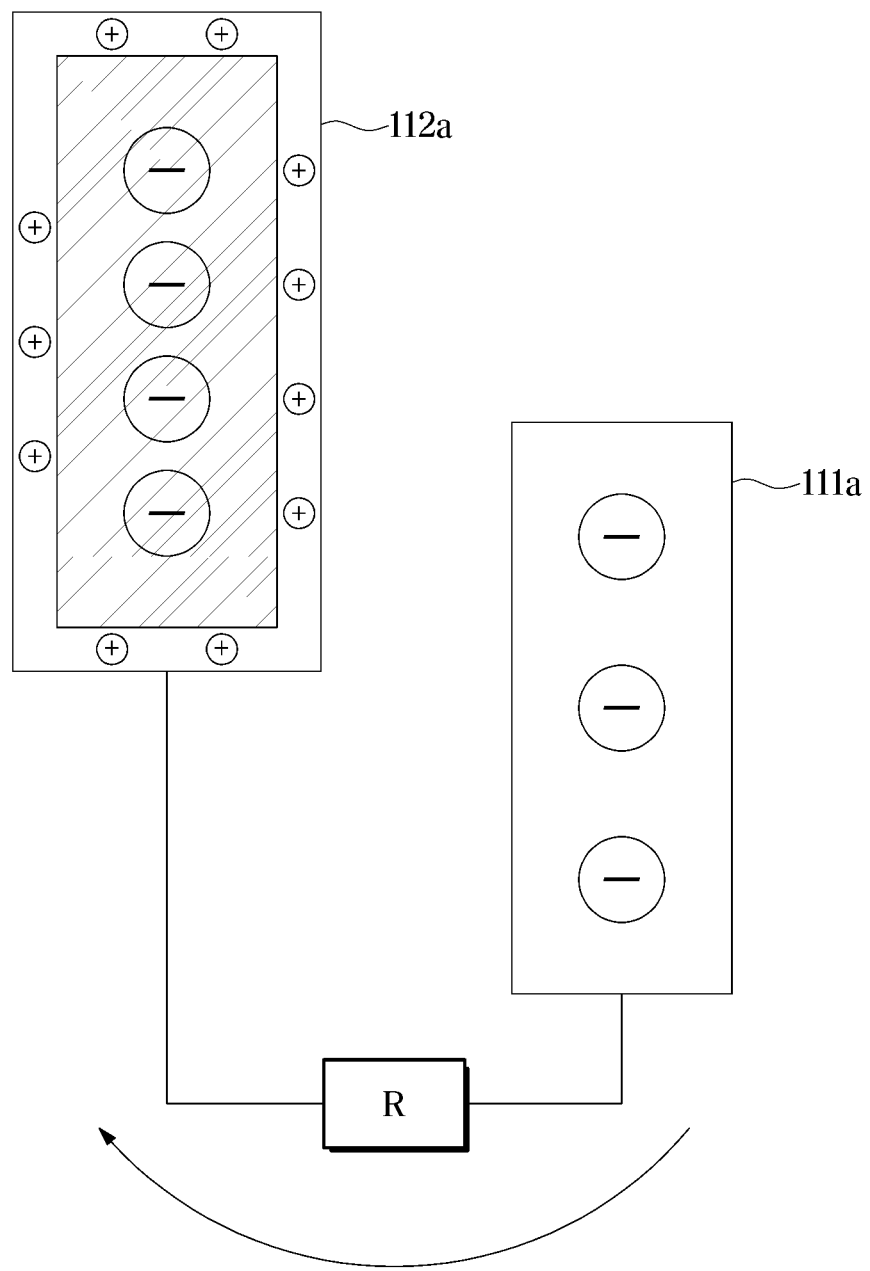

FIGS. 4, 5, and 6 are views schematically illustrating a flow of charge between a fixed electrode and a moving electrode of a vehicle key in one form of the present disclosure.

Figure 7:
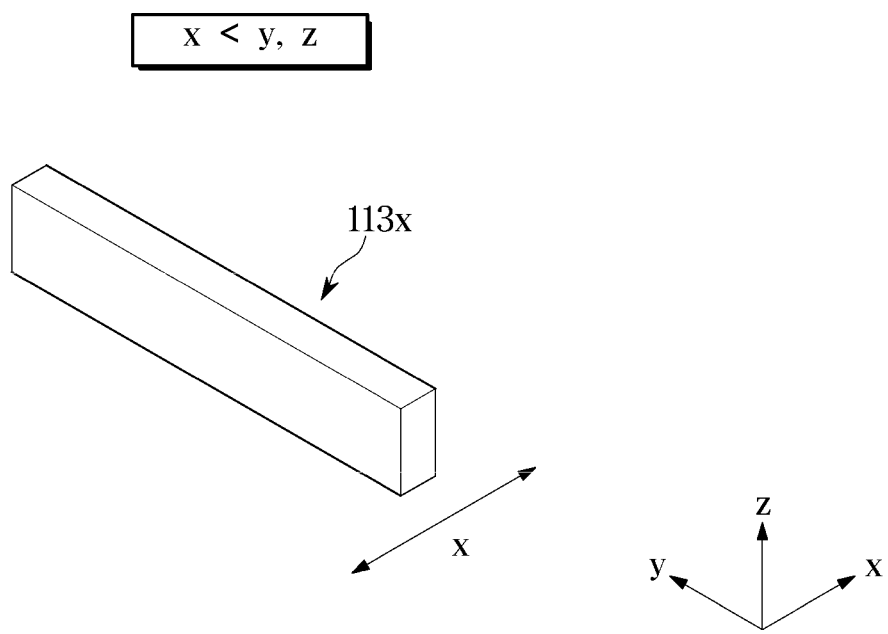

FIG. 7 is a view illustrating a spring structure applied to an X-axis electrode module.

Figure 8:
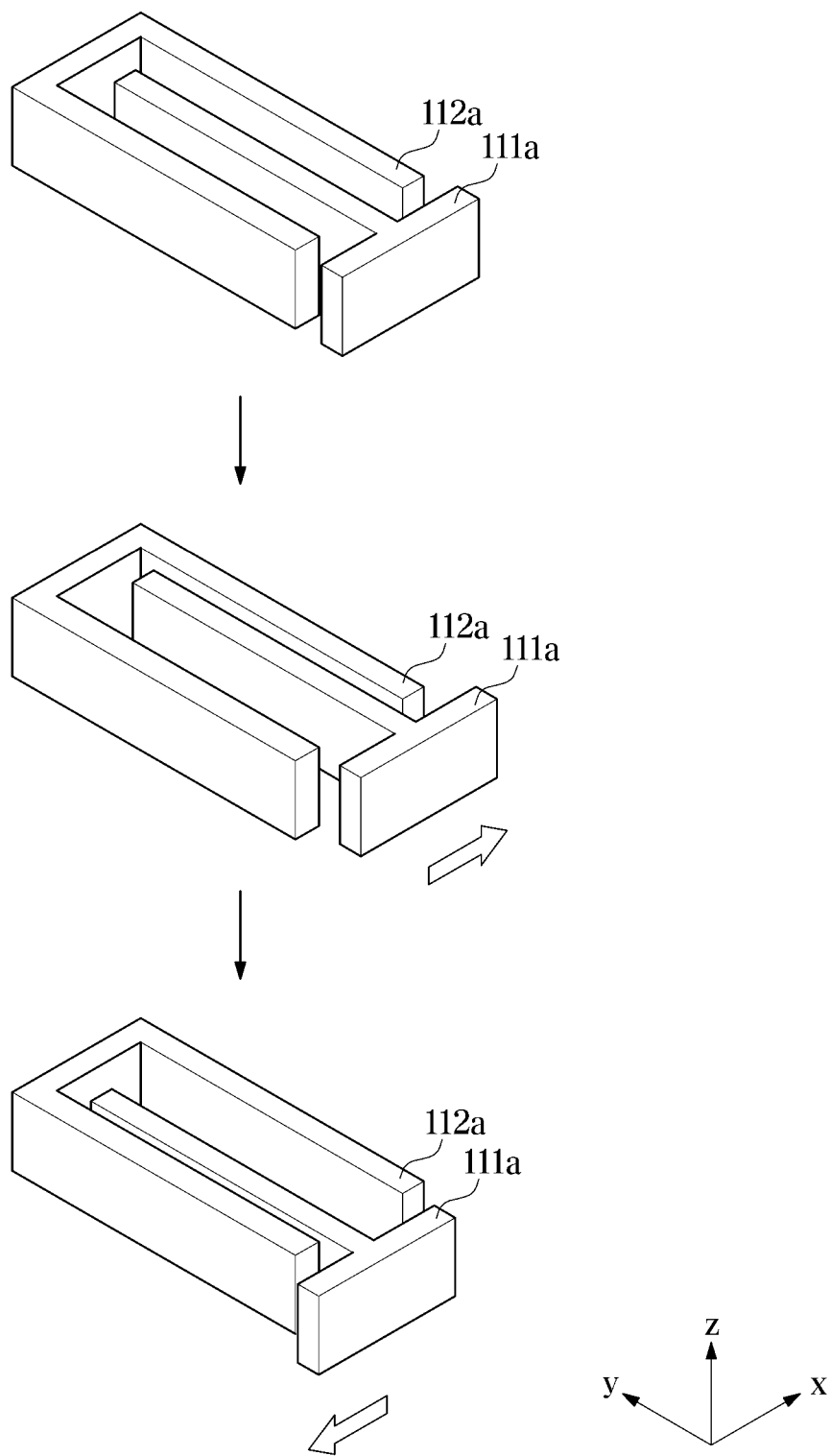

FIG. 8 is a view illustrating a direction in which a moving electrode included in an X-axis electrode module moves.

Figure 9:
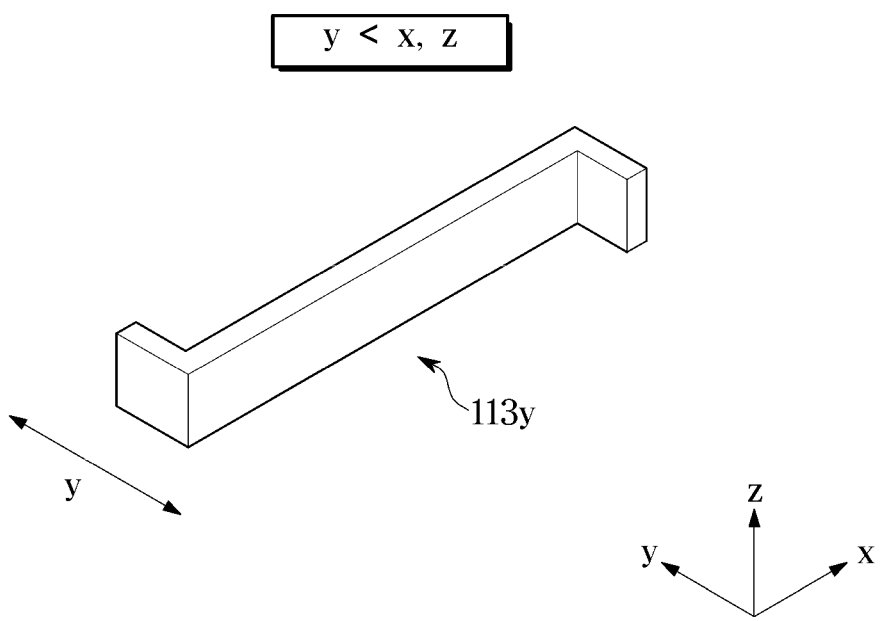

FIG. 9 is a view illustrating a spring structure applied to a Y-axis electrode module.

Figure 10:
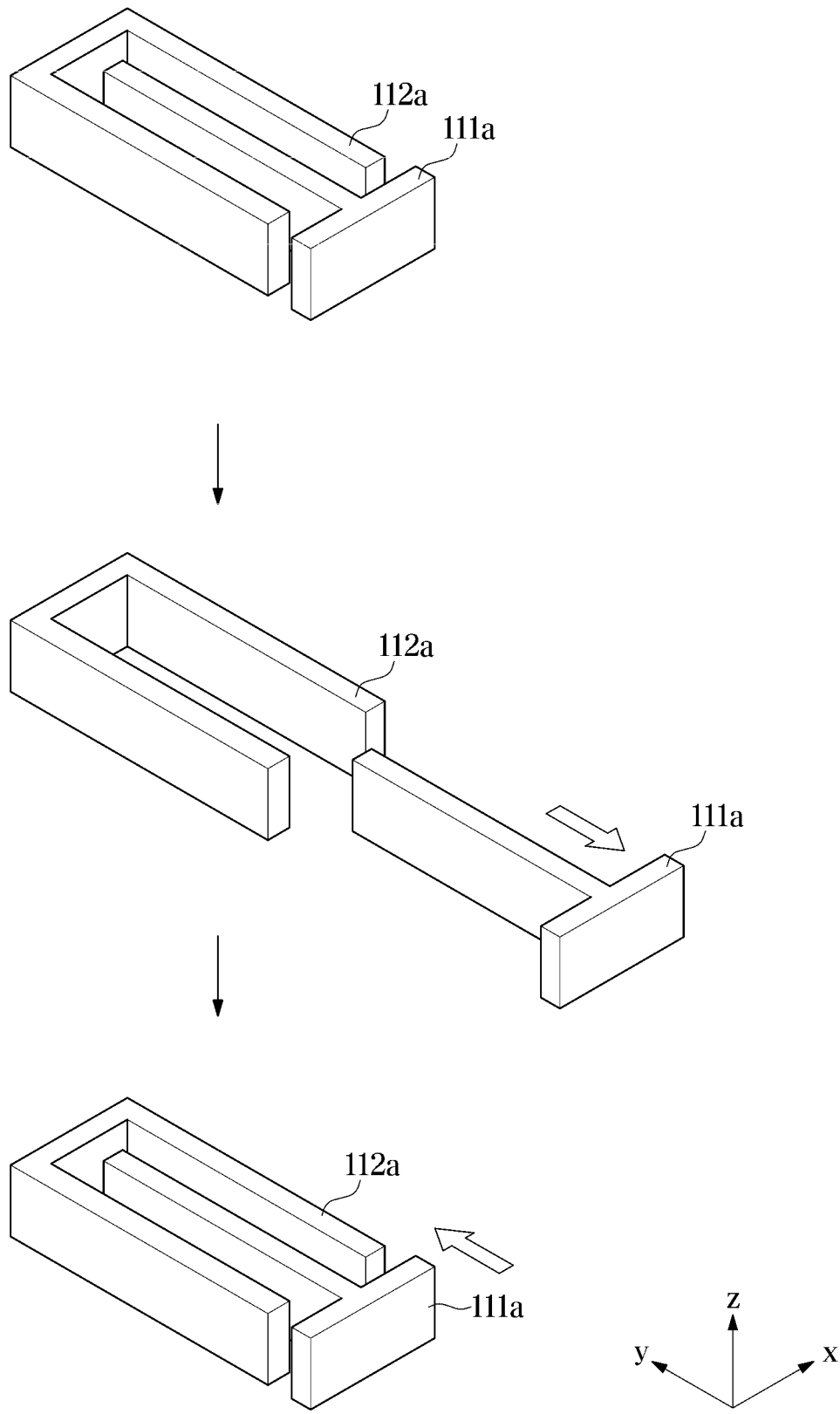

FIG. 10 is a view illustrating a moving direction of a moving electrode included in a Y-axis electrode module.

Figure 11:
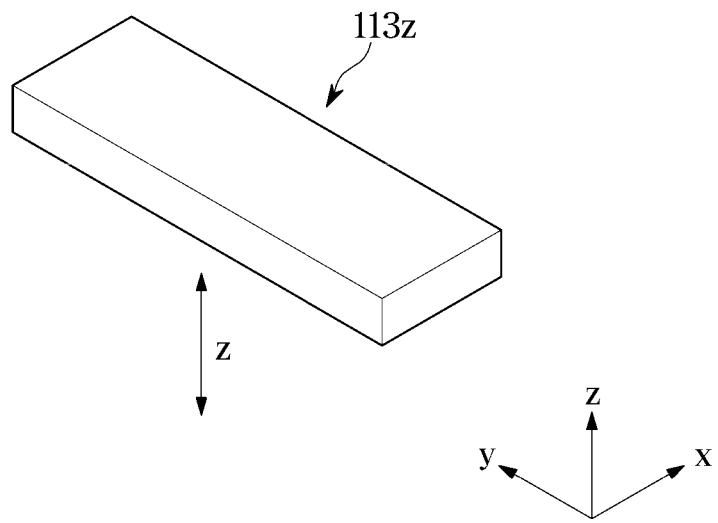

FIG. 11 is a view illustrating a spring structure applied to a Z-axis electrode module.

Figure 12:
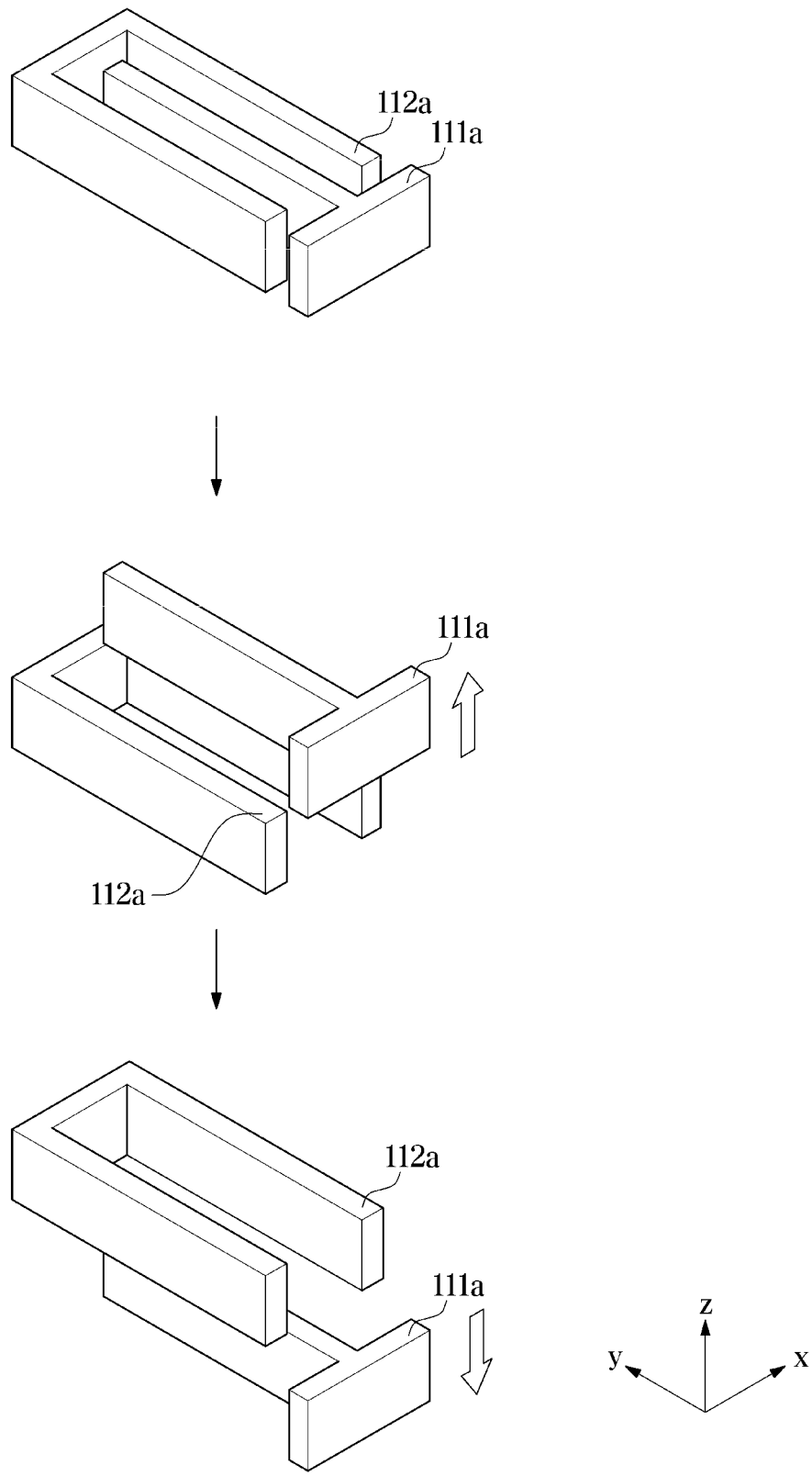

FIG. 12 is a view illustrating a direction in which a moving electrode included in a Z-axis electrode module moves.

Figure 13:
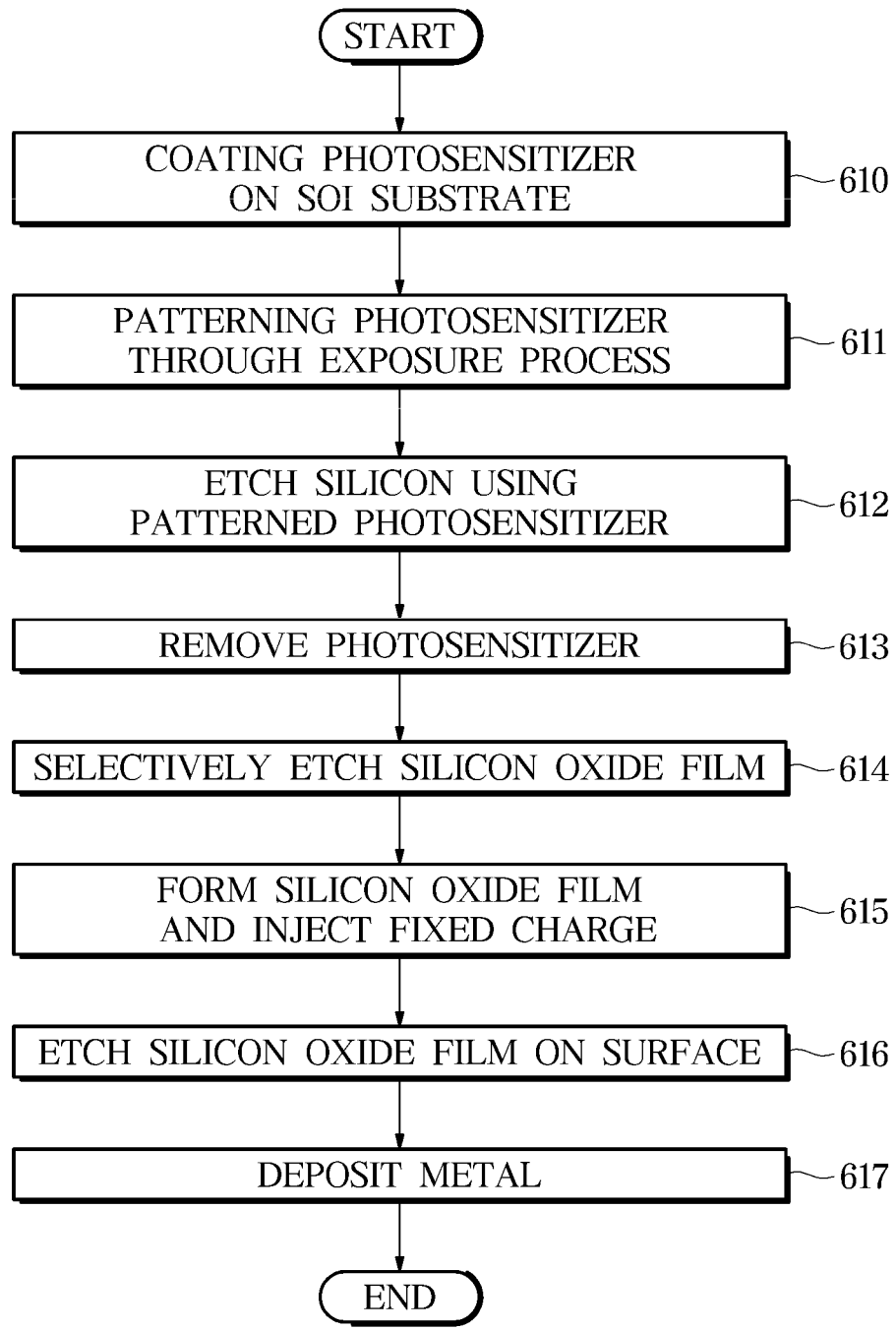

FIG. 13 is a flowchart illustrating a method of manufacturing a vehicle in one form of the present disclosure.

FIGS. 14 and 15 are views schematically illustrating a process performed at each step of a method of manufacturing a vehicle key in one form of the present disclosure.

DETAILED DESCRIPTION

The following description is merely exemplary in nature and is not intended to limit the present disclosure, application, or uses. It should be understood that throughout the drawings, corresponding reference numerals indicate like or corresponding parts and features.

Configurations and drawings described herein are examples of the disclosure, and there may be various modifications that can replace the exemplary forms and drawings of the present disclosure at the time of filing of the present application.

Also, the terminology used herein is for the purpose of describing particular forms only and is not intended to be limiting of the disclosure. Singular expressions include plural expressions unless the context clearly indicates otherwise. As used herein, the terms "comprise", "comprise" or "have" are intended to designate that the features, numbers, steps, actions, components, parts, or combinations thereof described in the specification are present, and it does not preclude the existence or addition of one or more other features or numbers, steps, operations, components, parts or combinations thereof in advance.

In addition, terms such as "~part", "~group", "~block", "~member", "~module" may refer to a unit for processing at least one function or operation. For example, the terms may refer to at least one hardware processed by at least one piece of hardware such as a field-programmable gate array (FPGA)/application specific integrated circuit (ASIC), at least one software stored in a memory, or a processor.

Hereinafter, a vehicle key and a method of manufacturing the vehicle key according to an aspect will be described in detail with reference to the accompanying drawings.

Figure 1:
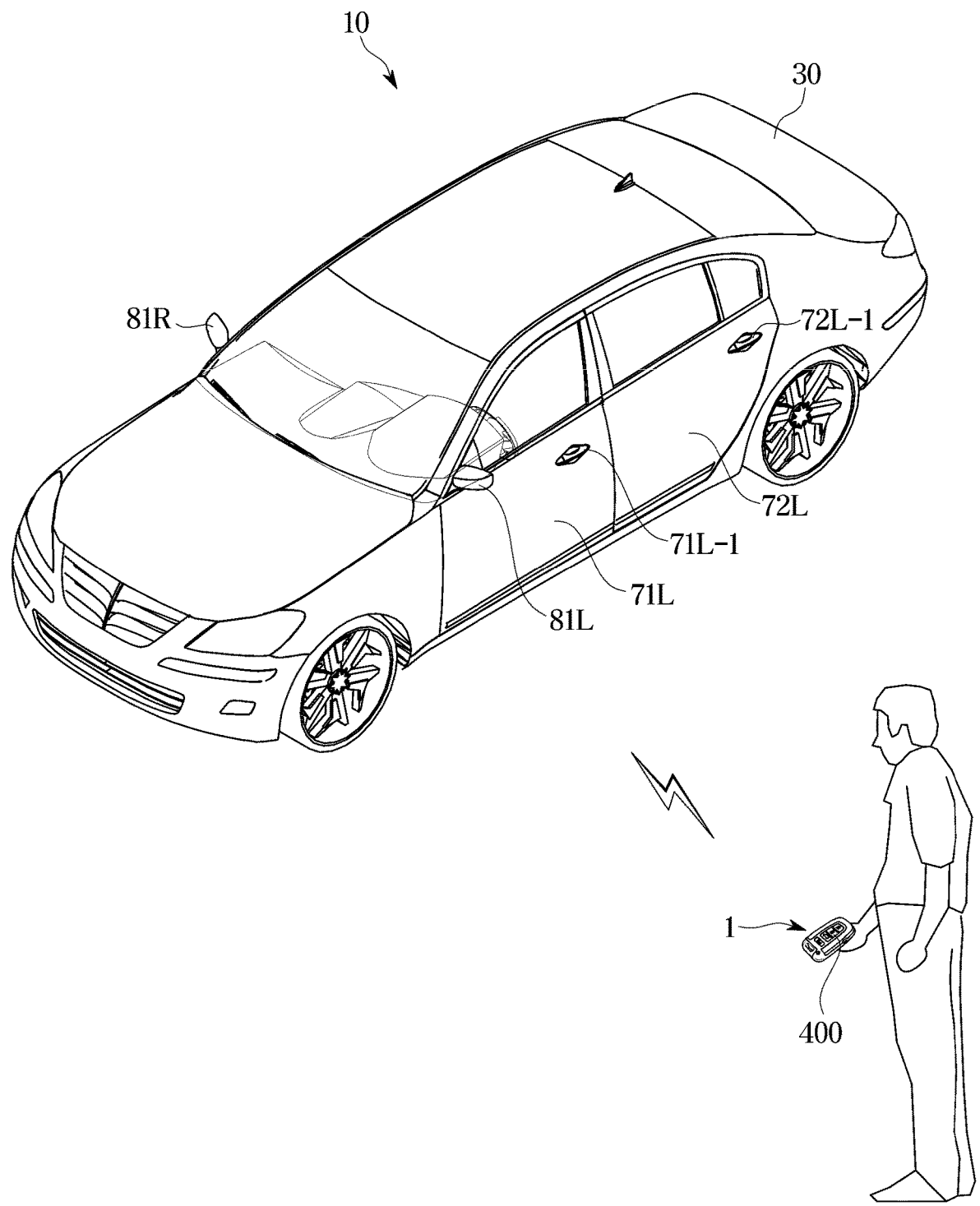
FIG. 1 is a view illustrating an appearance of a vehicle key in one form of the present disclosure.
Figure 2:
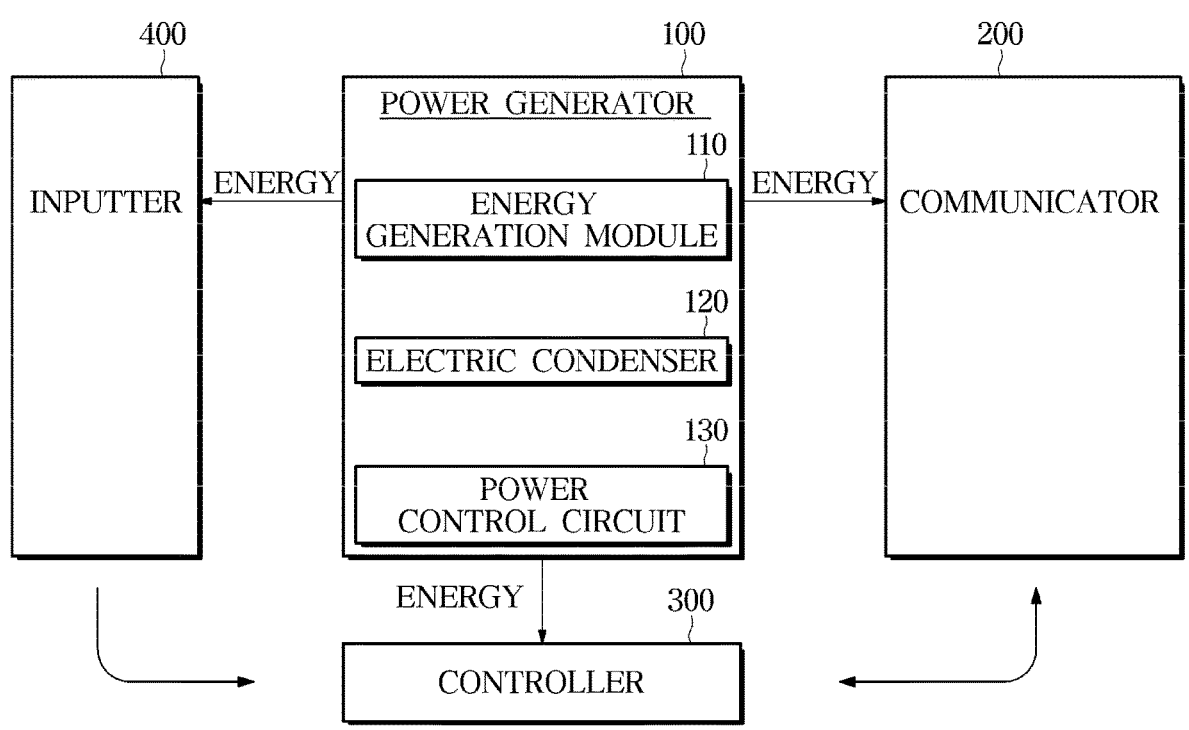
FIG. 2 is a control block diagram of a vehicle key in one form of the present disclosure.

FIG. 1 is a view illustrating an appearance of a vehicle key according to an embodiment, and FIG. 2 is a control block diagram of a vehicle key according to an embodiment.

Referring to FIG. 1, when a vehicle key 1 completes authentication by performing wireless communication with a vehicle 10, the vehicle key 1 may remotely unlock doors 71L and 72L or a trunk door 30 of the vehicle 10 or remotely lock the doors 71L and 72L or the trunk door 30.

Further, the vehicle key 1 may remotely fold or unfold side mirrors 81L and 81R of the vehicle 10 when the authentication is completed by performing wireless communication with the vehicle 10.

In addition, when the vehicle key 1 completes the authentication by performing wireless communication with the vehicle 10, when a user operates a start button provided in the vehicle 10, an ignition of the vehicle 10 may be turned on.

The vehicle key 1 may be provided in a size and a shape that can be carried and held by the user, and an inputter 400 for receiving user input may be provided outside.

The user may input a command for locking or unlocking the doors 71L and 72L or the trunk door 30 through the inputter 400, a command for folding or unfolding the side mirrors 81L and 81R, and the like.

The vehicle key 1 needs to be wirelessly powered due to characteristics of the vehicle key 1 as a portable device, and in the past, a battery may be mounted on the vehicle key 1 to receive power wirelessly. However, the battery needs to be replaced periodically and there is a limit to reducing the size of the vehicle key 1 due to a size of the battery.

The vehicle key 1 does not require the battery because it generates power by itself using energy harvesting. Hereinafter, a configuration and operation of the vehicle key 1 will be described in detail.

Referring to FIG. 2, the vehicle key 1 may include a power generator 100 including an energy generation module 110 for generating electrical energy using energy harvesting and an electric condenser 120 for storing the generated electrical energy, an inputter 400 for receiving a user input, a communicator 200 for communicating with the vehicle 10, and a controller 300 for controlling the communicator 200 to transmit a signal corresponding to the received user input to the vehicle 10.

An energy harvesting technology is a technology used to collect energy generated from natural energy sources such as sunlight, vibration, heat, and wind power and convert it into electrical energy. The vehicle key 1 may generate electrical energy using the energy harvesting technology, thereby supplying power to itself without using the battery.

The energy generation module 110 of the power generator 100 may generate electrical energy using the energy harvesting technology. The energy generation module 110 may generate the electrical energy using vibration among various types of natural energy sources. As a result, it is possible to be less subject to temporal and spatial constraints, unlike the case of using solar or wind power. It is possible to use the vibrations continuously generated when the user moves with the vehicle key 1 or moves the vehicle 10 with the vehicle key 1 on the vehicle 10, thereby increasing energy production efficiency.

The electric condenser 120 may store the electrical energy generated by the energy generation module 110. The electric condenser 120 may include at least one element capable of storing energy, such as a capacitor.

The power generator 100 may further include a power control circuit 130. The power control circuit 130 may supply electrical energy generated by the energy generation module 110 to each component of the vehicle key 1 that needs it.

As described above, the inputter 400 may receive a command for locking or unlocking the doors 71L and 72L of the vehicle 10, a command for folding or unfolding the side mirrors 81L and 81R of the vehicle 10, and the like. In addition, a command for opening and closing the trunk door 30 of the vehicle 10 may be input.

The communicator 200 may include an antenna that transmits and receives a low frequency (LF) signal or a radio frequency (RF) signal. Thus, the vehicle 10 and the vehicle key 1 may perform a mutual authentication procedure using an LF communication network or an RF communication network. For example, when the vehicle 10 transmits a search signal in a LF band, the vehicle key 1 that has received the search signal may transmit a response signal in the RF band to the vehicle 10. The response signal may include information necessary for authentication, and the information necessary for authentication may vary depending on a purpose of authentication.

The search signal in the LF band transmitted by the vehicle 10 has a shorter threshold distance (hereinafter, referred to as an LF threshold distance) capable of transmitting and receiving the signal due to the characteristics of the LF band compared to the RF signal. When the vehicle key 1 is located within the LF threshold distance from the vehicle 10, the vehicle key 1 may receive the search signal from the vehicle 10 through the LF communication network, and transmit the response signal to the vehicle 10 through the RF communication network.

However, when the vehicle key 1 is not located within the LF threshold distance from the vehicle 10, even if the vehicle 10 transmits the search signal to the surroundings through the LF communication network, the vehicle key 1 may not receive it and may not transmit the response signal to the vehicle 10.

Therefore, only when the vehicle key 1 is located at a distance adjacent to the vehicle 10 (within an LF threshold distance), the vehicle key 1 may receive the search signal from the vehicle 10 and perform mutual authentication.

When the inputter 400 receives the user input, the controller 300 may generate a request signal corresponding to the received user input, and transmit the generated request signal by controlling the communicator 200 to the vehicle 10.

For example, when the inputter 400 receives the user input requesting the lock of the door, the controller 300 may generate the request signal for locking the door and control the communicator 200 to transmit the generated request signal to the vehicle 10.

The controller 300 may include at least one memory in which programs for performing the above-described operations and operations described below is stored, and at least one processor for executing the stored program. The memory and the processor may be integrated on one chip or may be physically separated.

The inputter 400, the communicator 200 and the controller 300 need power to perform the above-described operations. The power may be supplied from the power generator 100. Hereinafter, an operation in which the power generator 100 generates power will be described in detail.

Figure 3:
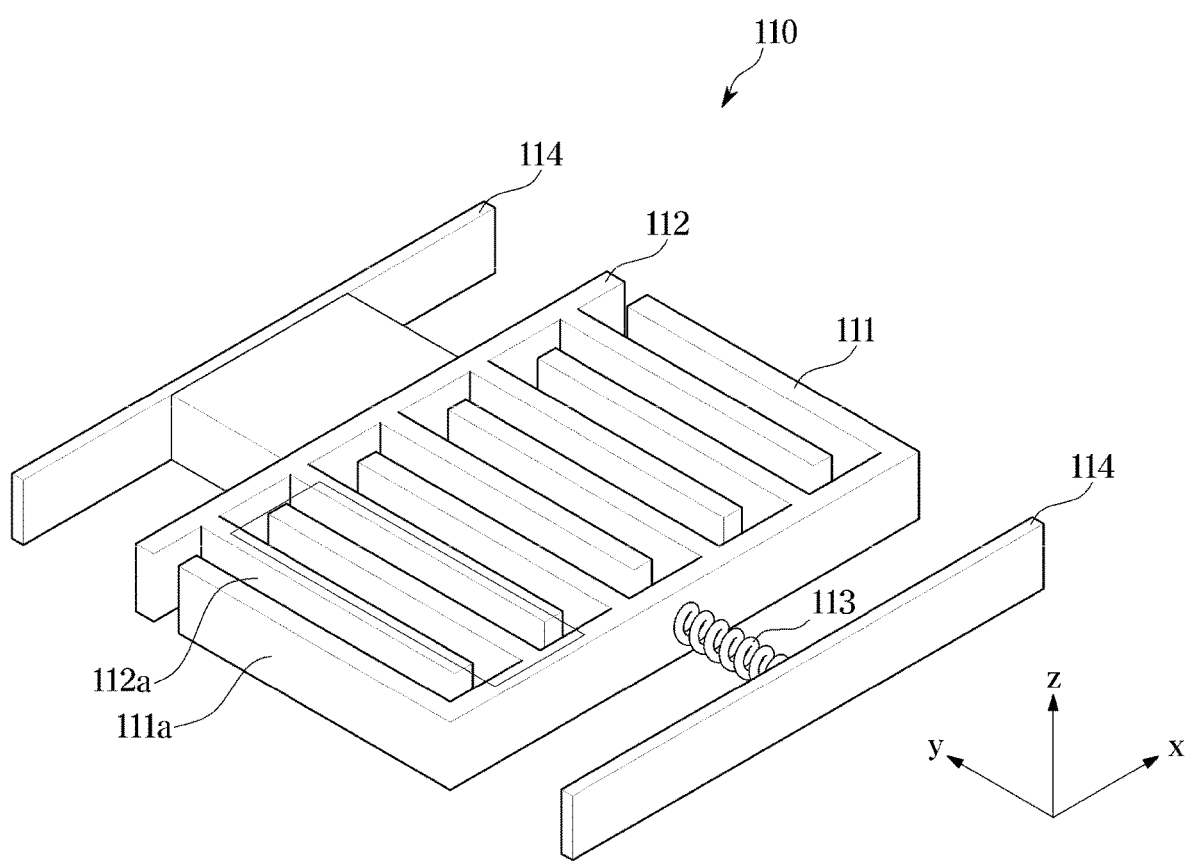
FIG. 3 is a view illustrating an example of a structure applicable to an energy generation module of a vehicle key in one form of the present disclosure.

FIG. 3 is a view illustrating an example of a structure applicable to an energy generation module of a vehicle key according to an embodiment.

As described above, the energy generation module 110 may generate electrical energy in an electrostatic method using vibration. To this end, a structure as illustrated in FIG. 3 may be employed. When using the electrostatic method, unlike an electromagnetic method, the energy generation module 110 may be manufactured through a semiconductor process by not requiring a magnet, and the electrical energy may be generated even by low frequency vibration using a spring structure as described below.

Referring to FIG. 3, the energy generation module 110 may include a fixed electrode 112a and a moving electrode 111a. The fixed electrode 112a and the moving electrode 111a may be arranged side by side, and a current may flow between the fixed electrode 112a and the moving electrode 111a by moving the moving electrode 111a.

Further, a fixed electrode structure 112 may be formed by arranging the plurality of fixed electrodes 112a side by side, and a moving electrode structure 111 may be formed by arranging the plurality of moving electrodes 111a side by side.

In addition, the plurality of fixed electrodes 112a and the plurality of moving electrodes 111a are alternately arranged to realize an interdigitated comb finger shape. Accordingly, the amount of electrical energy generated may be effectively increased.

As illustrated in FIG. 3, the moving electrode structure 111 may be connected to one substrate 114 through a spring 113 so that it can move along a direction of vibration. A description related to the structure of the spring 113 will be described later.

FIGS. 4, 5, and 6 are views schematically illustrating a flow of charge between a fixed electrode and a moving electrode of a vehicle key according to an embodiment.

Referring to FIG. 4, a non-conductive thin film such as SIO2 may be formed on at least one surface of the moving electrode 111a and the fixed electrode 112a, and a fixed charge may be injected into the non-conductive thin film. The surface illustrated in FIG. 4 is a surface parallel to an YZ axis plane.

FIG. 4 illustrates a case where the non-conductive thin film is formed on the fixed electrode 112a. Of course, it is also possible that the non-conductive thin film is formed on the moving electrode 111a.

As illustrated in FIGS. 5 and 6, when the moving electrode 111a moves by vibration, a relative electric field change occurs, and a flow of charge, that is, a current may be generated between the fixed electrode 112a and the moving electrode 111a due to the electric field change. The adjacent moving electrode 111a and the fixed electrode 112a may operate as a unit generating the current.

The energy generation module 110 in which the plurality of moving electrodes 111a and the plurality of fixed electrodes 112a are integrated may generate sufficient electrical energy to operate the vehicle key 1 according to the above-described method. The electrical energy may be supplied directly to the inputter 400, the controller 300, or the communicator 200, or stored in the electric condenser 120 and then supplied when needed.

Meanwhile, the energy generation module 110 may not only generate electrical energy by vibration applied in one direction, but may generate electrical energy using all vibrations applied in the X-axis, Y-axis, and Z-axis directions. To this end, the energy generation module 110 may include an X-axis electrode module that converts vibration applied in the X-axis direction into electrical energy, a Y-axis electrode module that converts vibration applied in the Y-axis direction into electrical energy, and a Z-axis electrode module that converts vibration applied in the Z-axis direction into electrical energy.

The X-axis electrode module, the Y-axis electrode module, and the Z-axis electrode module may each include the moving electrode structure 111 and the fixed electrode structure 112 of the above-described structure. The structure of the interdigitated comb finger is the same, but the X-axis electrode module may have a structure of the spring 113 for vibrating in the X-axis direction, the Y-axis electrode module may have a structure of the spring 113 for vibrating in the Y-axis direction, and the Z-axis electrode module may have a structure of the spring 113 for vibrating in the Z-axis direction.

For example, the spring 113 may be implemented as a rod-shaped spring, and a length of the axis to be vibrated is formed to be shorter than the length of the other axis so that the moving electrode 112a connected to the spring 113 in the direction of the axis easily vibrates.

FIG. 7 is a view illustrating a spring structure applied to an X-axis electrode module, and FIG. 8 is a view illustrating a direction in which a moving electrode included in an X-axis electrode module moves.

Referring to FIG. 7, an X-axis spring 113x applied to the X-axis electrode module may shorten the length in the X-axis direction. When the X-axis spring 113x having such a structure is connected to an X-axis moving electrode 111a-1, the X-axis moving electrode 111a-1 may be easily moved in the X-axis direction as illustrated in FIG. 8.

FIG. 9 is a view illustrating a spring structure applied to a Y-axis electrode module, FIG. 10 is a view illustrating a moving direction of a moving electrode included in a Y-axis electrode module.

Referring to FIG. 9, a Y-axis spring 113y applied to the Y-axis electrode module may shorten the length in the Y-axis direction. When the Y-axis spring 113x having such a structure is connected to a Y-axis moving electrode 111a-2, the Y-axis moving electrode 111a-2 may be easily moved in the Y-axis direction as illustrated in FIG. 10.

FIG. 11 is a view illustrating a spring structure applied to a Z-axis electrode module, FIG. 12 is a view illustrating a direction in which a moving electrode included in a Z-axis electrode module moves.

Referring to FIG. 11, a Z-axis spring 113z applied to the Z-axis electrode module may shorten the length in the Z-axis direction. When the Z-axis spring 113y having such a structure is connected to a Z-axis moving electrode 111a-3, the Z-axis moving electrode 111a-3 may be easily moved in the Z-axis direction as illustrated in FIG. 12.

The vehicle key 1 may have a structure in which the X-axis electrode module, the Y-axis electrode module, and the Z-axis electrode module are integrated on one substrate 114. Through this structures, the electrical energy may be generated by using vibrations in the X-axis, Y-axis, and Z-axis directions. In addition, the electric condenser 120 and the power control circuit 130 may also be integrated on the same substrate 114 as the X-axis electrode module, Y-axis electrode module, and Z-axis electrode module.

For example, when an acceleration of a force applied from the outside is in a range of 10 to 1000 m/s2, the electrical energy generated by the energy generation module 110 according to a size of the load resistance may have an output range of 2.74 nW to 132 µW.

When the power generator 100 of the vehicle key 1 generates energy by itself using energy harvesting according to the above-described embodiment, it is possible to prevent an inoperable state due to battery discharge in advance, and to eliminate inconvenience caused by battery replacement.

In addition, since an opening for replacing the battery is eliminated, the dustproof and waterproof functions are improved, and a thinner thickness can be realized as compared to the case where the battery is mounted.

Alternatively, when the vehicle key 1 is implemented to be equipped with the battery, the battery and the power generator 100 may be used together to extend a life of the battery, or the user may urgently generate energy required by applying vibration to the vehicle key 1 in a situation where the battery is discharged.

On the other hand, the vehicle key 1 having the above-described structure may be manufactured by the semiconductor process. Hereinafter, a method of manufacturing the vehicle key 1 according to the embodiment will be described. The vehicle key generated by the method of manufacturing the vehicle key 1 according to the embodiment may be the vehicle key 1 according to the above-described embodiment. The method of manufacturing described later may be applied when manufacturing the energy generation module 110 of the vehicle key 1.

FIG. 13 is a flowchart illustrating a method of manufacturing a vehicle key according to an embodiment, and FIGS. 14 and 15 are views schematically illustrating a process performed at each step of a method of manufacturing a vehicle key according to an embodiment.

Referring to FIGS. 13, 14, and 15, according to the method of manufacturing the vehicle key 1, a photosensitizer 110b may be coated on a silicon-on-insulator (SOI) wafer 110a composed of a silicon substrate 110a-3, a silicon oxide film 110a-2, and a silicon 110a-1 (610).

An exposure process for patterning the photosensitizer 110b in the shape of the fixed electrode structure 112, the moving electrode structure 111, and the spring 113 described above in the embodiment of the vehicle key 1 may be performed (611).

The silicon 110a-1 may be etched by using the patterned photosensitizer 110b (612), and the photosensitizer 110b may be removed (613).

In order to remove the silicon oxide film 110a-2 between the silicon 110a-1 and the silicon substrate 110a-3 so that the moving electrode 111 can move, the silicon oxide film 110a-2 is selectively etched (614).

The silicon oxide film 110a-4 may be formed again on the silicon substrate 110a-3 and the silicon 110a-1, and at the same time, the fixed charge may be injected (615), and an isotropic silicon oxide film etching process may be performed to remove the silicon oxide film 110a-4 on the surface to expose the silicon (616).

A metal 110c for use as the electrode may be deposited (617).

As described above, when the vehicle key 1 is manufactured using the semiconductor manufacturing process, a thin thickness may be realized, and all structures may be manufactured with only one exposure process, thereby lowering manufacturing cost and increasing yield by simplifying the process.

According to the vehicle key and the method of manufacturing the vehicle key according to the embodiments, the electrical energy may be generated by an energy harvesting method to supply power to itself without using the battery that requires replacement.

According to the vehicle key and the method of manufacturing the vehicle key according to the embodiments, by generating electrical energy using vibration, vibration generated by walking of a holder of the vehicle key, vibration generated by driving of the vehicle, and the like may be used for power supply.

According to a vehicle key and a method of manufacturing the vehicle according to one aspect, by employing electrostatic energy harvesting, compatibility with a semiconductor process may be improved and low frequency vibration may be converted into energy.

Embodiments of the disclosure have thus far been described with reference to the accompanying drawings. It should be apparent to those of ordinary skill in the art that the disclosure may be practiced in other forms than the embodiments as described above without changing the technical idea or essential features of the disclosure. The above embodiments are only by way of example, and should not be interpreted in a limited sense.

What is claimed is:

1. A vehicle key for opening and closing a door of a vehicle, the vehicle key comprising:
    a power generator further comprising:
        an energy generation module configured to generate an electrical energy using energy harvesting, the electrical energy being generated using vibration applied in three directions; and
        an electric condenser configured to store the generated electrical energy;
    an inputter configured to receive a user input;
    a communicator configured to communicate with the vehicle; and
    a controller configured to control the communicator to transmit a control signal corresponding to the received user input to the vehicle, wherein the communicator and the controller are configured to receive power from the power generator.

2. The vehicle key according to claim 1, wherein the energy generation module is configured to generate the electrical energy in an electrostatic manner using the vibration.

3. The vehicle key according to claim 2, wherein the energy generation module comprises:
    a fixed electrode; and
    a moving electrode disposed in parallel with the fixed electrode, wherein a current flows between the fixed electrode and the moving electrode by a movement of the moving electrode.

4. A vehicle key for opening and closing a door of a vehicle, the vehicle key comprising:
    a power generator further comprising:
        an energy generation module configured to generate an electrical energy using energy harvesting; and
        an electric condenser configured to store the generated electrical energy;
    an inputter configured to receive a user input;
    a communicator configured to communicate with the vehicle; and
    a controller configured to control the communicator to transmit a control signal corresponding to the received user input to the vehicle, wherein the communicator and the controller are configured to receive power from the power generator;
    wherein the energy generation module comprises:
        an X-axis electrode module configured to generate a current by vibration in an X-axis direction;
        a Y-axis electrode module configured to generate the current by vibration in a Y-axis direction; and
        a Z-axis electrode module configured to generate the current by vibration in a Z-axis direction.

5. The vehicle key according to claim 4, wherein the X-axis electrode module further comprises:
    an X-axis fixed electrode; and
    an X-axis moving electrode disposed in parallel with the X-axis fixed electrode, the X-axis moving electrode configured to move in the X-axis direction.

6. The vehicle key according to claim 4, wherein the Y-axis electrode module further comprises:
    a Y-axis fixed electrode; and
    a Y-axis moving electrode disposed in parallel with the Y-axis fixed electrode, the Y-axis moving electrode configured to move in the Y-axis direction.

7. The vehicle key according to claim 4, wherein the Z-axis electrode module comprises:
    a Z-axis fixed electrode; and
    a Z-axis moving electrode disposed in parallel with the Z-axis fixed electrode, the Z-axis moving electrode configured to move in the Z-axis direction.

8. The vehicle key according to claim 5, wherein the X-axis electrode module further comprises an X-axis spring configured to connect the X-axis moving electrode to a substrate, wherein, in the X-axis spring, a length of the X-axis is shorter than a length of the Y-axis or a length of the Z-axis.

9. The vehicle key according to claim 6, wherein the Y-axis electrode module further comprises a Y-axis spring configured to connect the Y-axis moving electrode to a substrate, wherein, in the Y-axis spring, a length of the Y-axis is shorter than a length of the X-axis or a length of the Z-axis.

10. The vehicle key according to claim 7, wherein the Z-axis electrode module further comprises a Z-axis spring configured to connect the Z-axis moving electrode to a substrate, wherein, in the Z-axis spring, a length of the Z-axis is shorter than a length of the X-axis or a length of the Y-axis.

11. The vehicle key according to claim 3, wherein at least one of the fixed electrode or the moving electrode comprises a non-conductive thin film formed on its surface, wherein the non-conductive thin film comprises an injected charge.

12. The vehicle key according to claim 1, wherein the power generator further comprises a power control circuit configured to supply the generated electrical energy to the communicator and the controller.

13. The vehicle key according to claim 1, wherein the energy generation module is manufactured by a semiconductor process.

14. A vehicle key for opening and closing a door of a vehicle, the vehicle key comprising:
    a power generator further comprising:
        an energy generation module configured to generate an electrical energy using energy harvesting, the electrical energy being generated in an electrostatic manner using vibration; and
        an electric condenser configured to store the generated electrical energy;
    an inputter configured to receive a user input;

a communicator configured to communicate with the vehicle; and a controller configured to control the communicator to transmit a control signal corresponding to the received user input to the vehicle, wherein the communicator and the controller are configured to receive power from the power generator;

wherein the energy generation module comprises:
  a fixed electrode; and
  a moving electrode disposed in parallel with the fixed electrode, wherein a current flows between the fixed electrode and the moving electrode by a movement of the moving electrode; and wherein at least one of the fixed electrode or the moving electrode comprises a non-conductive thin film formed on its surface, wherein the non-conductive thin film comprises an injected charge.

15. The vehicle key according to claim 14, wherein the energy generation module further comprises:
  an X-axis electrode module configured to generate a current by vibration in an X-axis direction;
  a Y-axis electrode module configured to generate the current by vibration in a Y-axis direction; and
  a Z-axis electrode module configured to generate the current by vibration in a Z-axis direction.

16. The vehicle key according to claim 15, wherein the X-axis electrode module further comprises an X-axis fixed electrode and an X-axis moving electrode disposed in parallel with the X-axis fixed electrode, the X-axis moving electrode configured to move in the X-axis direction;
  wherein the Y-axis electrode module further comprises a Y-axis fixed electrode and a Y-axis moving electrode disposed in parallel with the Y-axis fixed electrode, the Y-axis moving electrode configured to move in the Y-axis direction; and
  wherein the Z-axis electrode module comprises a Z-axis fixed electrode and a Z-axis moving electrode disposed in parallel with the Z-axis fixed electrode, the Z-axis moving electrode configured to move in the Z-axis direction.

17. The vehicle key according to claim 16, wherein the X-axis electrode module further comprises an X-axis spring configured to connect the X-axis moving electrode to a substrate, wherein, in the X-axis spring, a length of the X-axis is shorter than a length of the Y-axis or a length of the Z-axis;
  wherein the Y-axis electrode module further comprises a Y-axis spring configured to connect the Y-axis moving electrode to the substrate, wherein, in the Y-axis spring, a length of the Y-axis is shorter than a length of the X-axis or a length of the Z-axis; and
  wherein the Z-axis electrode module further comprises a Z-axis spring configured to connect the Z-axis moving electrode to the substrate, wherein, in the Z-axis spring, a length of the Z-axis is shorter than a length of the X-axis or a length of the Y-axis.

18. The vehicle key according to claim 14, wherein the power generator further comprises a power control circuit configured to supply the generated electrical energy to the communicator and the controller.

19. The vehicle key according to claim 14, wherein the energy generation module is manufactured by a semiconductor process.

* * * * *